(12) United States Patent
Lee et al.

(10) Patent No.: US 8,168,469 B2
(45) Date of Patent: May 1, 2012

(54) NONVOLATILE MEMORY DEVICE MADE OF RESISTANCE MATERIAL AND METHOD OF FABRICATING THE SAME

(75) Inventors: Jung-hyun Lee, Gyeonggi-do (KR); Sung-kyu Choi, Gyeonggi-do (KR); Kyu-sik Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/923,429

(22) Filed: Sep. 21, 2010

(65) Prior Publication Data

US 2011/0008945 A1 Jan. 13, 2011

Related U.S. Application Data

(62) Division of application No. 11/295,551, filed on Dec. 7, 2005, now Pat. No. 7,820,996.

(30) Foreign Application Priority Data

Jan. 31, 2005 (KR) .................. 10-2005-0008752

(51) Int. Cl.
*H01L 29/02* (2006.01)
(52) U.S. Cl. ............ 438/102; 438/103; 257/2; 257/314; 257/239; 257/261; 365/185.1
(58) Field of Classification Search .................. 257/314, 257/239, 261, 2; 365/185.1; 438/102–103
See application file for complete search history.

(56) References Cited

U.S. PATENT DOCUMENTS

| 3,761,896 A | 9/1973 | Davidson |
| 4,472,296 A | 9/1984 | Hunter et al. |
| 5,099,302 A | 3/1992 | Pavlin |
| 5,640,343 A | 6/1997 | Gallagher et al. |
| 5,751,012 A | 5/1998 | Wolstenholme et al. |
| 6,151,241 A | 11/2000 | Hayashi et al. |
| 6,358,756 B1 | 3/2002 | Sandhu et al. |
| 6,436,757 B1 | 8/2002 | Kitamura |

(Continued)

FOREIGN PATENT DOCUMENTS

CN 1340213 A 3/2002

(Continued)

OTHER PUBLICATIONS

U.S. Office Action from related U.S. Appl. No. 11/654,626 dated Sep. 30, 2010.

(Continued)

*Primary Examiner* — Jenny L Wagner
*Assistant Examiner* — Jami M Valentine
(74) *Attorney, Agent, or Firm* — Harness, Dickey & Pierce, P.L.C.

(57) ABSTRACT

A nonvolatile memory device using a resistance material and a method of fabricating the same are provided. The nonvolatile memory device includes a switching element, and a data storage part electrically connected to the switching element. In the data storage part, a lower electrode is connected to the switching element, and an insulating layer is formed on the lower electrode to a predetermined thickness. The insulating layer has a contact hole exposing the lower electrode. A data storage layer is filled in the contact hole and the data storage layer is formed of transition metal oxide. An upper electrode is formed on the insulating layer and the data storage layer.

11 Claims, 6 Drawing Sheets

U.S. PATENT DOCUMENTS

| | | |
|---|---|---|
| 6,487,110 B2 | 11/2002 | Nishimura et al. |
| 6,522,573 B2 | 2/2003 | Saito et al. |
| 6,583,003 B1 | 6/2003 | Hsu et al. |
| 6,590,244 B2 | 7/2003 | Asao et al. |
| 6,815,744 B1 | 11/2004 | Beck et al. |
| 2002/0036917 A1 | 3/2002 | Nishimura et al. |
| 2002/0063274 A1 | 5/2002 | Kanaya et al. |
| 2002/0079526 A1 | 6/2002 | Fukuda et al. |
| 2003/0048666 A1 | 3/2003 | Eldridge et al. |
| 2003/0072195 A1 | 4/2003 | Mikolajick |
| 2003/0096468 A1 | 5/2003 | Soininen et al. |
| 2003/0156467 A1 | 8/2003 | Gilton et al. |
| 2003/0156468 A1 | 8/2003 | Campbell et al. |
| 2003/0189851 A1 | 10/2003 | Brandenberger et al. |
| 2003/0209971 A1* | 11/2003 | Kozicki ............... 313/498 |
| 2004/0113192 A1 | 6/2004 | Wicker |
| 2005/0009361 A1 | 1/2005 | DeBoer et al. |
| 2005/0247921 A1 | 11/2005 | Lee et al. |
| 2007/0132049 A1 | 6/2007 | Stipe |

FOREIGN PATENT DOCUMENTS

| | | |
|---|---|---|
| CN | 1450561 | 10/2003 |
| EP | 1 179 837 | 2/2002 |
| EP | 1 355 356 | 10/2003 |
| EP | 1 484 799 | 12/2004 |
| JP | 62-042582 | 2/1987 |
| JP | 63-226981 | 9/1988 |
| JP | 02-058264 | 2/1990 |
| JP | 06-509909 | 11/1994 |
| JP | 2001-237380 | 8/2001 |
| JP | 2002-537627 | 11/2002 |
| JP | 2004-342843 | 12/2004 |
| JP | 2004-363604 | 12/2004 |
| KR | 101995002113 | 7/1995 |
| KR | 1020030034500 | 5/2003 |
| KR | 2004-0055594 | 6/2004 |
| KR | 10 2004 0104967 | 12/2004 |
| WO | 94/24707 | 10/1994 |
| WO | 00/47797 | 8/2000 |
| WO | 00/49659 | 8/2000 |
| WO | 03/028124 | 4/2003 |

OTHER PUBLICATIONS

European Search Report dated Jun. 8, 2006.
Korean Office Action dated Jul. 11, 2006.
European Search Report dated May 16, 2006.
Chinese Office Action dated Feb. 9, 2007.
Jansen R., et al. "Influence of barrier impurities on the magnetoresistance in ferromagnetic tunnel junctions," Journal of Applied Physics, Jun. 1, 1998, pp. 6682-6684, vol. 83, No. 11, American Institute of Physics, NY, USA.
Communications Pursuant to Article 96(2) EPC issued in corresponding European Patent Application No. 04 253 135, Apr. 23, 2007, cover sheet and pp. 1-2, EPO, Munich, DE.
Korean Office Action dated Jun. 26, 2007 (with English Translation).
Chinese Office Action dated Oct. 18, 2007.
Chinese Office Action dated Mar. 21, 2008.
European Patent Office Action dated May 8, 2008.
Baek et al., "Highly Scalable Non-Volatile Resistive Memory using Simple Binary Oxide Driven by Asymmetric Unipolar Voltage Pulses," IEEE International Electron Devices Meeting, IEEE 2004, published Dec. 13-15, 2004.
Bruyere et al., "Switching and Negative Resistance in Thin Films of Nickel Oxide," Applied Physics Letters, vol. 16, No. 1, Jan. 1, 1970.
Sim et al., "Resistance Switching Characteristics of Polycrystalline Nb2O5 for Nonvolatile Memory Application," IEEE Electron Device Letters, vol. 26; No. 5, p. 292, published May 2005.
Zhuang et al., "Novel Colossal Magnetoresistive thin film nonvolatile resistance random access memory (RRAM)," IEEE Electron Devices Meeting, 2002. IEDM '02. Digest. International Dec. 8-11, 2002 pp. 193-196.
Japanese Office Action and English translation dated Oct. 19, 2009.
European Search Report dated Feb. 12, 2010.

* cited by examiner

NONVOLATILE MEMORY DEVICE MADE OF RESISTANCE MATERIAL AND METHOD OF FABRICATING THE SAME

CROSS-REFERENCE TO RELATED PATENT APPLICATION

The present application is a divisional of and claims priority under 35 U.S.C. §120/§121 to U.S. application Ser. No. 11/295,551 filed on Dec. 7, 2005 now U.S. Pat. No. 7,820,996, which claims priority under 35 U.S.C. §119 to Korean Patent Application No. 10-2005-0008752, filed on Jan. 31, 2005, in the Korean Intellectual Property Office, the disclosure of each of which is expressly incorporated herein in its entirety by reference.

BACKGROUND OF THE INVENTION

1. Field of the Invention

Embodiments of the present invention relate to a nonvolatile memory device made of resistance material and a method of fabricating the same, and more particularly, to a nonvolatile memory device capable of providing high integration and reducing a reset current and a method of fabricating the same.

2. Description of the Related Art

Ferroelectric RAM (FRAM), magnetic RAM (MRAM) and phase-change RAM (PRAM) are nonvolatile memory devices made of resistance material. While DRAM or flash memory stores binary data using charges, FRAM, MRAM and PRAM store binary data using a polarization characteristic of a ferroelectric material, a resistance change of a magnetic tunnel junction (MTJ) thin film based on magnetic properties of ferromagnets, and a resistance change due to a phase change, respectively. Since they have the high integration characteristics of DRAM and nonvolatile characteristics of flash memory, FRAM, MRAM and PRAM are considered to be alternatives to conventional volatile or nonvolatile memory devices.

As one of the nonvolatile memory devices using a resistance material, the PRAM stores binary data using properties displayed by phase-change materials such as GeSbTe (GST). These materials can switch between a crystalline state and an amorphous state due to local heat generated by electric pulses. A memory cell of the PRAM comprise a phase-change layer, a resistor, and a switching transistor. Generally, the transistor is formed on a silicon wafer, and the resistor and the phase-change layer are formed on the transistor. The phase-change layer is generally a GST base material called chalcogenide. The resistor is used to heat the phase-change layer. The phase-change layer changes between a crystalline state and an amorphous state depending on a degree of heat, resulting in a change of resistance. Since the current flowing through the resistor is proportional to a voltage, binary data can be stored and read.

Meanwhile, the resistance materials of conventional nonvolatile memory devices have good etching resistance. Thus, when using a conventional DRAM process, it is difficult to etch the resistor and, even though this is possible, it takes a long time to etch the resistor. For these reasons, conventional nonvolatile memory devices have reduced productivity, increased manufacturing costs and as a result are uncompetitive in markets. Accordingly, new resistance materials are increasingly in demand.

Also, since the resistors of the conventional nonvolatile memory devices are formed of a thin film type using physical vapor deposition (PVD), it is difficult to obtain a dense and uniform layer quality. It is also difficult to control a composition ratio of elements constituting the resistors, which can have a great influence on the switching characteristics of the memory devices.

A method of depositing metal oxide using an MOCVD method is disclosed in a Korean Patent Laid-Open Publication No. 2004-0055594. This publication discloses a technology of forming a metal-containing layer using a precursor. Meanwhile, an oxygen content of the metal-containing layer influences a switching characteristic of the memory device. The MOCVD method has a limitation in controlling the oxygen content. Also, since the metal-containing layer has a thin film shape, the high integration potential and reduction of reset current ability are limited. Accordingly, there is a demand for a memory device structure that can provide high integration and reduction of reset current.

OBJECTS AND SUMMARY

Embodiments of the present invention provide a nonvolatile memory device capable of providing high integration and reduction of reset current and a method of fabricating the same.

According to an aspect of embodiments of the present invention, there is provided a nonvolatile memory device including a switching element and a data storage part electrically connected to the switching element. Preferably, the data storage part includes: a lower electrode connected to the switching element; an insulating layer formed on the lower electrode to a predetermined thickness, the insulating layer having a contact hole exposing the lower electrode; a data storage layer filling the contact hole, the data storage layer formed of transition metal oxide; and an upper electrode formed on the insulating layer and the data storage layer.

According to another aspect of embodiments of the present invention, there is provided a method of fabricating a nonvolatile memory device, preferably including: preparing a switching element; forming a lower electrode connected to the switching element; forming an insulating layer in the lower electrode to a predetermined thickness; forming a contact hole on the insulating layer such that the lower electrode is exposed; forming a data storage layer of transition metal oxide in the contact hole; and forming an upper electrode on the insulating layer and the data storage layer.

According to embodiments of the present invention, a three-dimensional data storage layer may be obtained. Because of this three-dimensional structure, the size of the data storage layer may be reduced, while the storage performance is not degraded. Also, the three-dimensional data storage layer may increase integration of the memory device and decrease a reset current ($I_{reset}$), which is preferred in data write and erase operation.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF THE INVENTION

Embodiments of the present invention will now be described more fully with reference to the accompanying drawings, in which exemplary embodiments of the invention are shown.

Figure 1:
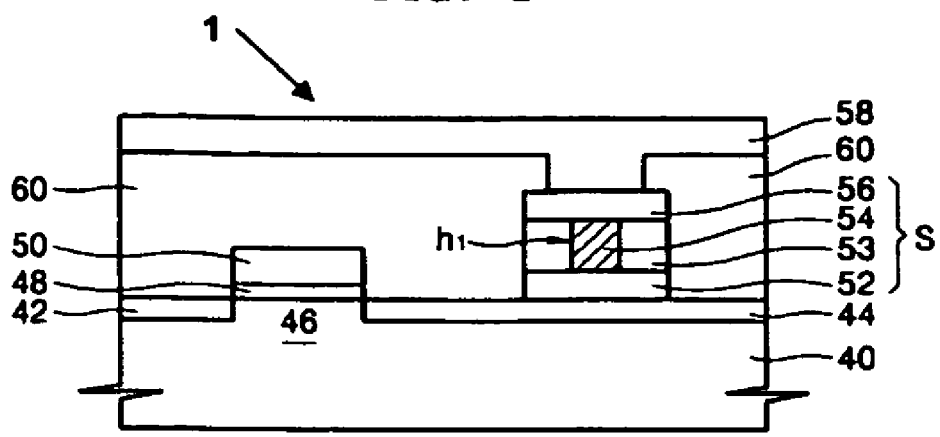
FIG. 1 is a schematic sectional view of a nonvolatile memory device using resistance material according to an embodiment of the present invention.

FIG. 1 is a schematic sectional view of a nonvolatile memory device 1 using resistance material according to a preferred embodiment of the present invention;

Referring to FIG. 1, the nonvolatile memory device 1 using the resistance material includes a substrate 40, a transistor formed on the substrate 40, and a data storage part S connected to a portion of the transistor. The transistor includes a source 42, a drain 44, and a gate stack structure formed on a channel region 46 between the source 42 and the drain 44. The source 42 and the drain 44 may be formed of doped conductive impurities. The gate stack structure includes a gate insulating layer 48 and a gate electrode 50, which are stacked in sequence. The transistors are one example of a suitable structure. A switching diode may also be provided instead of the transistor.

The data storage part S is formed on the drain 44 of the transistor. The data storage part S includes a lower electrode 52 connected to the drain 44, an insulating layer 53 formed on the lower electrode 52 to a predetermined thickness, where a contact hole h1 is formed to expose the lower electrode 52, a data storage layer 54, which may be formed of transition metal oxide to fill the contact hole h1, and an upper electrode 56 formed on the insulating layer 53 and the data storage layer 54.

Also, an interlayer insulating layer 60 is formed to cover the transistor and the data storage part S. An upper surface of the upper electrode 56 is exposed. A plate electrode 58 is formed on the interlayer insulating layer 60 and contacts the exposed region of the upper electrode 56. The plate electrode 58 and the upper electrode 56 may be formed of the same material.

The insulating layer 53 may be formed of $SiO_2$. The data storage layer 54 may be a variable resistance material of which resistance changes according to a voltage applied thereto. The data storage layer 54 may be formed of a transition metal oxide. The transition metal oxide may be an oxide material selected from the group consisting of Ni oxide (NiO), V oxide ($V_2O_5$), Zn oxide (ZnO), Nb oxide ($Nb_2O_5$), Ti oxide ($TiO_2$), W oxide ($WO_3$), and Co oxide (CoO). A principle of storing data using the resistance material formed of transition metal oxide (that is, the data storage layer 54) will be described with reference to FIG. 2.

Figure 2:
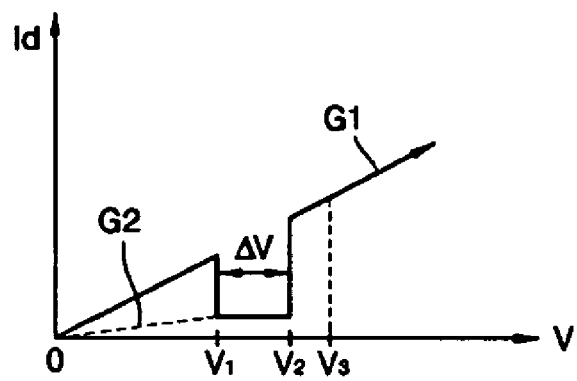
FIG. 2 is a graph illustrating a current-voltage characteristic of a data storage layer formed of transition metal oxide.

FIG. 2 is a graph illustrating a current-voltage characteristic of the data storage layer formed of a transition metal oxide, particularly a nickel oxide. In FIG. 2, a horizontal axis represents a voltage (V) applied to the data storage part S, and a vertical axis, represents a drain current ($I_d$) flowing between the source 42 and the drain 44 according to the applied voltage. As can be seen from FIG. 2, the transition metal oxide can have different resistances depending on the voltage applied thereto. Using the difference of the resistances, binary information can be stored and read.

A reference symbol G1 represents a first graph illustrating a first current-voltage characteristic when a resistance of the data storage part S (in more detail, the data storage layer 54) is reduced. A reference symbol G2 represents a second graph illustrating a second current-voltage characteristic when the resistance of the data storage layer 54 is increased (when the drain current ($I_d$) is lowered).

Referring to the first graph G1, the drain current $I_d$ changes in proportion to the voltage applied to the data storage layer 54. However, as the voltage applied to the data storage layer 54 becomes a first voltage $V_1$ ($V_1>0$), the resistance of the data storage layer 54 rapidly increases and the drain current $I_d$ of the data storage layer 54 rapidly decreases. This state is maintained until a second voltage $V_2$ ($V_2>V_1$) is applied to the data storage layer 54. That is, during $\Delta V$ ($V_1$-$V_2$), that is, while the voltage is applied to the data storage layer 54, the resistance of the data storage layer 54 rapidly increases. As the voltage applied to the data storage layer 54 becomes higher than the second voltage $V_2$, the resistance of the data storage layer 54 rapidly decreases, such that the change in the drain current $I_d$ of the data storage layer 54 is proportional to the applied voltage $V_1$, similar to when a voltage lower than the first voltage $V_1$ is applied to the data storage layer 54.

Meanwhile, even though the measured voltage is identical, the currents measured at the voltages lower than the first voltage $V_1$ are different depending on the levels of the voltages applied to the data storage layer 54 at a range of voltages higher than the first voltage $V_1$.

When the data storage layer 54 has a first resistance by applying a third voltage $V_3$ ($V_3>V_2$) to the data storage layer 54 and a voltage lower than the first voltage $V_1$ is applied to the data storage layer 54, the current according to the first graph G1 is measured from the data storage layer 54. This case will be referred to as a first case.

On the other hand, when the data storage layer 54 has a second resistance (greater than the first resistance) by applying a voltage of $V_1 \leq V \leq V_2$ to the data storage layer 54 and the voltage lower than the first voltage $V_1$ is applied to the data storage layer 54, the current according to the second graph G2 is measured from the data storage layer 54. This case will be referred to as a second case.

The current measured according to the second graph G2 is much smaller than the current measured according to the first graph G1. The resistance is inversely proportional to the current. It means that two different currents can be measured from the data storage layer 54. The two measured currents correspond to data 1 uses the first case and data 0 uses the second case, each of which is stored in the data storage layer 54.

The assignment of the data to the first case and the second case are arbitrary, that is, the first case may correspond to data 0, and the second case may correspond to data 1.

Figure 3:
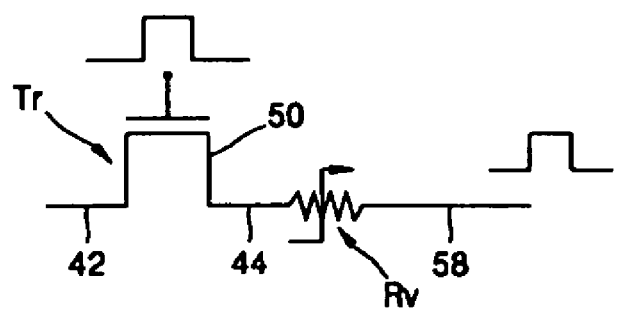
FIG. 3 is an equivalent circuit diagram of the nonvolatile memory device shown in FIG. 1.

FIG. 3 is an equivalent circuit diagram of the nonvolatile memory device shown in FIG. 1. A reference symbol $T_r$ represents the transistor and a reference symbol $R_v$ represents the variable resistance material corresponding to the data storage layer 54.

The data storage layer 54 is formed inside the contact hole h1 of the insulating layer 53. Therefore, the data storage layer 54 has a three-dimensional structure, not the thin-film structure of the related art. Because of this three-dimensional structure, the size of the data storage layer 54 may be reduced, while the storage performance is not degraded. The three-dimensional data storage layer 54 may increase integration of the memory device and decrease a reset current ($I_{reset}$), which is required in data write and erase operations.

Figure 4A:
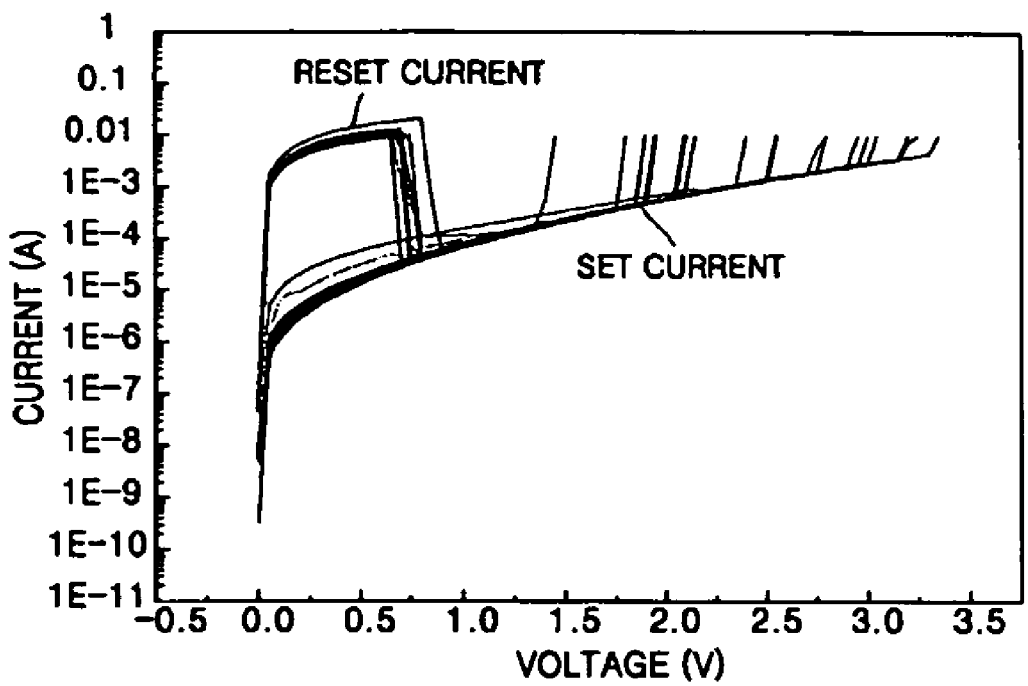
FIGS. 4A and 4B are graphs illustrating a current-voltage characteristic of a data storage layer according to an embodiment of the present invention and the related art.
Figure 4B:
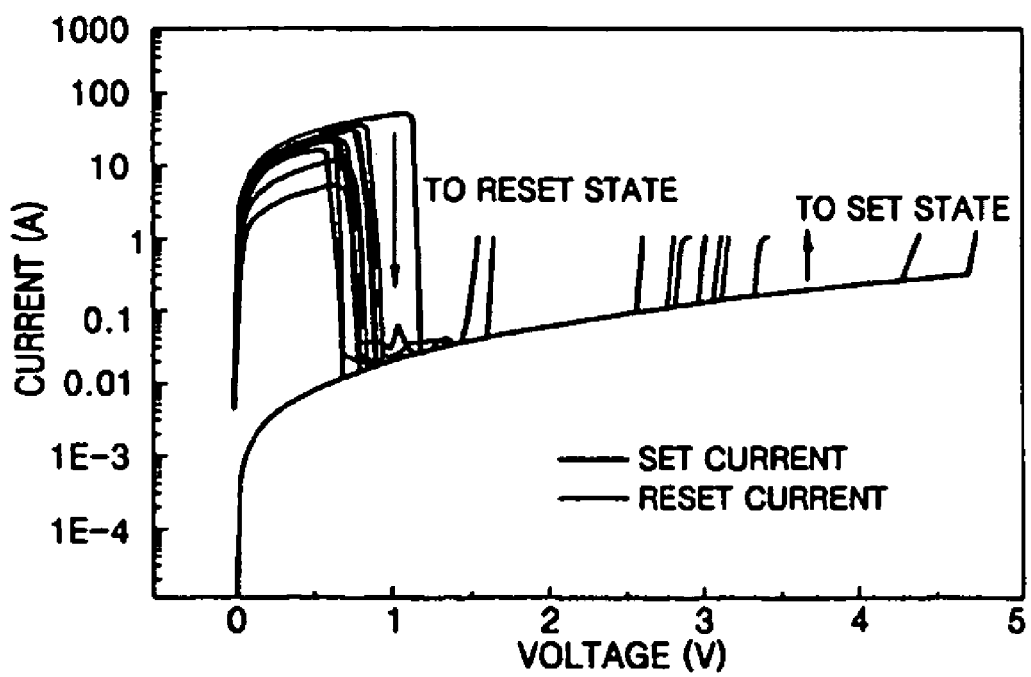

FIGS. 4A and 4B are graphs illustrating current-voltage characteristics of the data storage layers according to the related art and embodiments of the present invention, respectively. The data storage layer is formed of NiO using CVD (FIG. 4A) and PVD (FIG. 4B). It can be seen from FIGS. 4A and 4B that the three-dimensional data storage layer has better current-voltage characteristics than the thin-film type data storage layer.

FIGS. 5A through 5I are sectional views illustrating a method of fabricating the nonvolatile memory device using resistance material according to a preferred embodiment of the present invention.

Figure 5A:
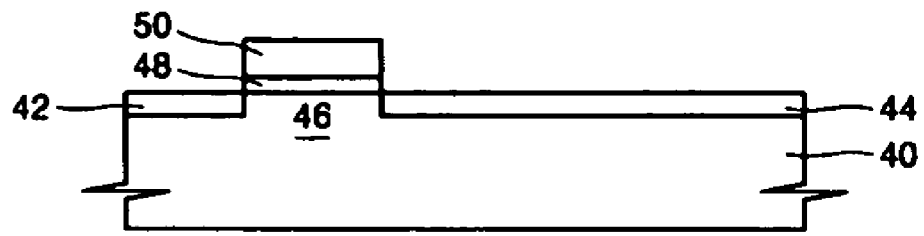
FIGS. 5A through 5I are sectional views illustrating a method of fabricating a nonvolatile memory device made of a resistance material according to a preferred embodiment of the present invention.

Referring to FIG. 5A, a transistor acting as a switching element is formed on a semiconductor substrate 40. The transistor includes the source 42, the drain 44, and the gate stack structure formed on the channel region 46 between the source 42 and the drain 44. The source 42 and the drain 44 may be formed of doped conductive impurities. The gate stack structure includes the gate insulating layer 48 and the gate electrode 50, which are stacked in sequence. The transistor is one example of a suitable structure. A switching diode may also be provided instead of the transistor.

Figure 5B:
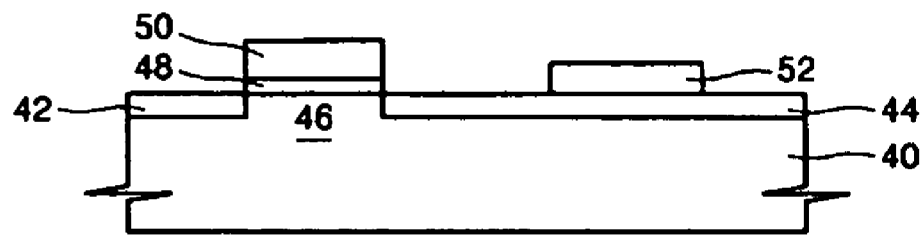
Figure 5C:
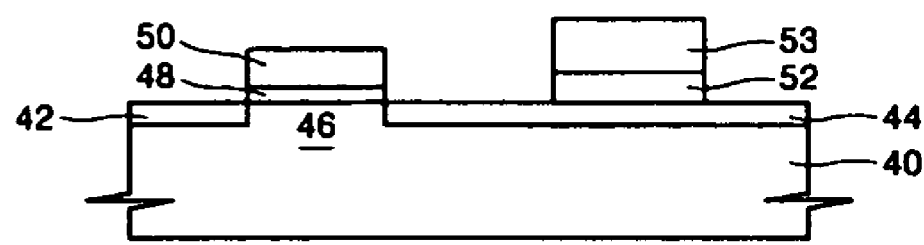
Figure 5D:
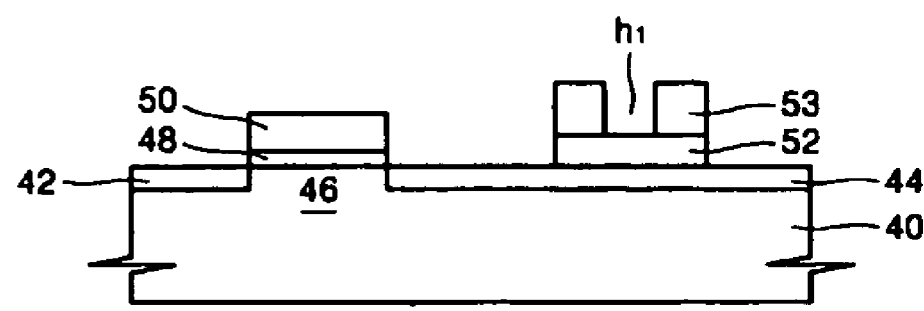
Figure 5E:
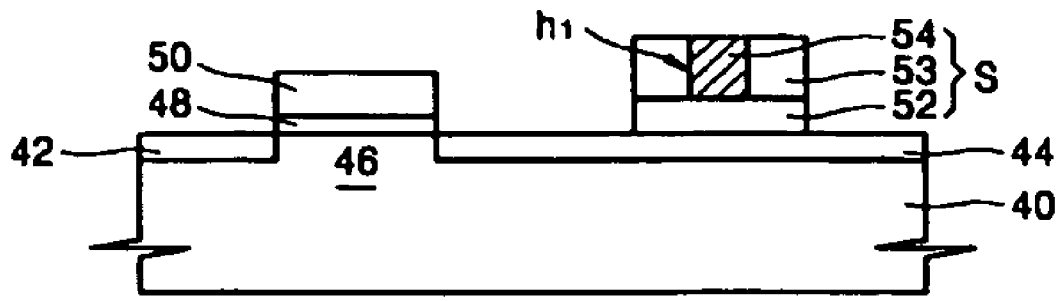
Figure 6:
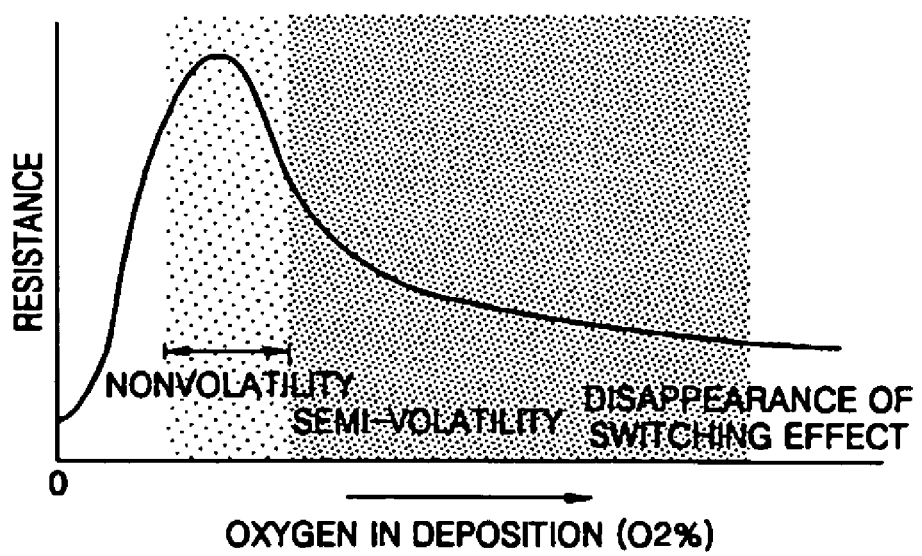
FIG. 6 is a graph of a switching characteristic of the data storage layer formed of transition metal oxide with varying oxygen content.

Referring to FIGS. 5B through 5D, the lower electrode 52 is formed on the drain 44 of the transistor and an insulating layer 53, preferably $SiO_2$, is formed on the lower electrode 52 to a predetermined thickness. Then, the insulating layer 53 is etched to form the contact hole h1 exposing a predetermined portion of the lower electrode 52. Referring to FIG. 5E, the contact hole h1 is preferably filled with a transition metal oxide to form the data storage layer 54. Though a transition metal oxide layer (not shown) may be further formed on the insulating layer 53, it may be removed by an etching process. It is preferable to perform a chemical vapor deposition (CVD) method in order to form the data storage layer 54 in the contact hole h1 having a predetermined depth. In the CVD method, a vapor transition metal and an oxygen source gas may react together. The oxygen content of a transition metal oxide may be controlled by alternately injecting $H_2O$, $O_2$, and $O_2$-activated plasma gas as the oxygen source. By controlling the oxygen content, a good switching characteristic of the data storage layer 54 may be obtained. How the switching characteristic depends on the oxygen content of a transition metal oxide (that is, the data storage layer 54) is illustrated in the graph of FIG. 6. Using the CVD method, the data storage layer 54 having a dense and uniform layer quality may be obtained. Specifically, the data storage layer may be three-dimensional, not a thin-film structure, by forming the data storage layer inside the contact hole h1 of the insulating layer 53. Using a conventional PVD method, the three-dimensional data storage layer is difficult to obtain. Also, with PVD, it is difficult to control the oxygen content when the data storage layer is formed of transition metal oxide.

Figure 5F:
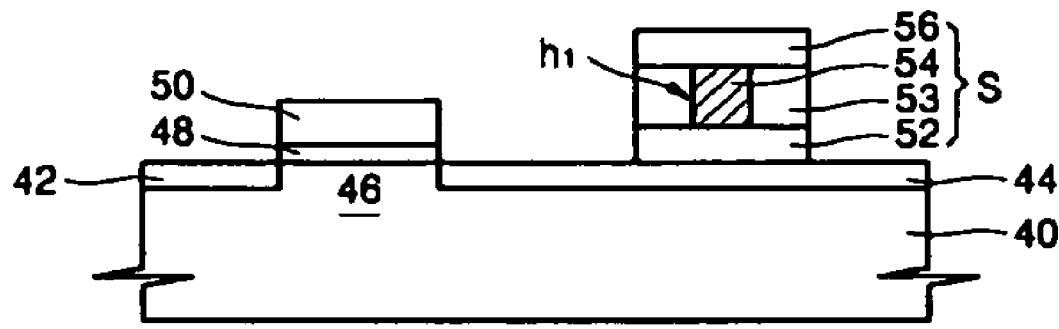
Figure 5G:
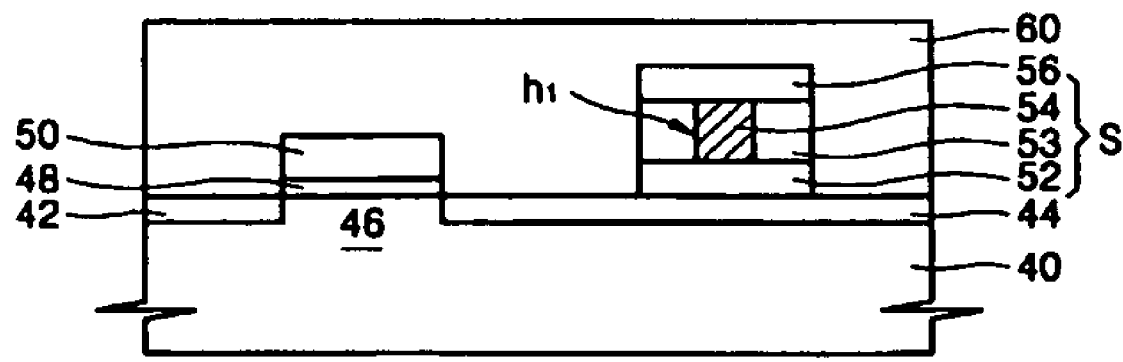
Figure 5H:
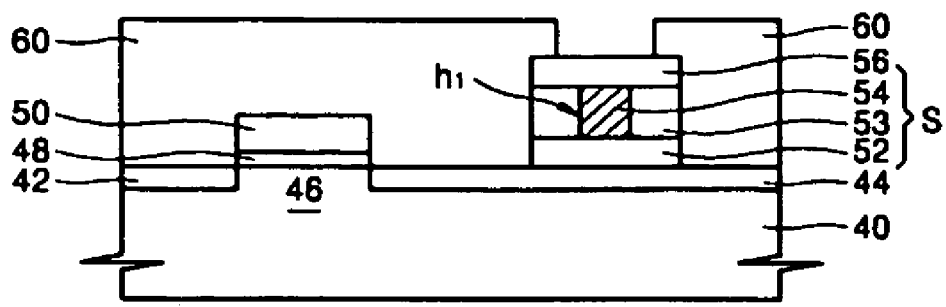
Figure 5I:
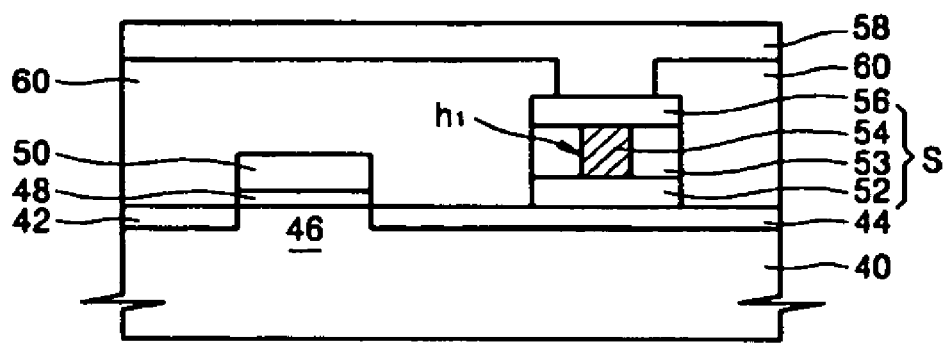

Referring to FIG. 5F, the upper electrode 56 is formed on the insulating layer 53 and the data storage layer 54. Referring to FIGS. 5G through 5I, the interlayer insulating layer 60 is formed to cover the transistor and the data storage part S. Then, the interlayer insulating layer is etched to partially expose the upper surface of the upper electrode 56. The plate electrode 58 is formed on the interlayer insulating layer 60 and the exposed portion of the upper electrode 56.

According to embodiments of the present invention, the data storage layer 54 may have a three-dimensional structure. Thus, the size of the data storage layer 54 is smaller, and the storage characteristic is not degraded. The three-dimensional data storage layer 54 may increase the integration of the memory device and decrease the reset current ($I_{reset}$), which is required in data write and erase operations.

FIG. 6 is a graph of a switching characteristic according to the oxygen content of the data storage layer formed of transition metal oxide. As can be seen, the oxygen content may considerably influence the switching characteristic of the data storage layer.

Figure 7:
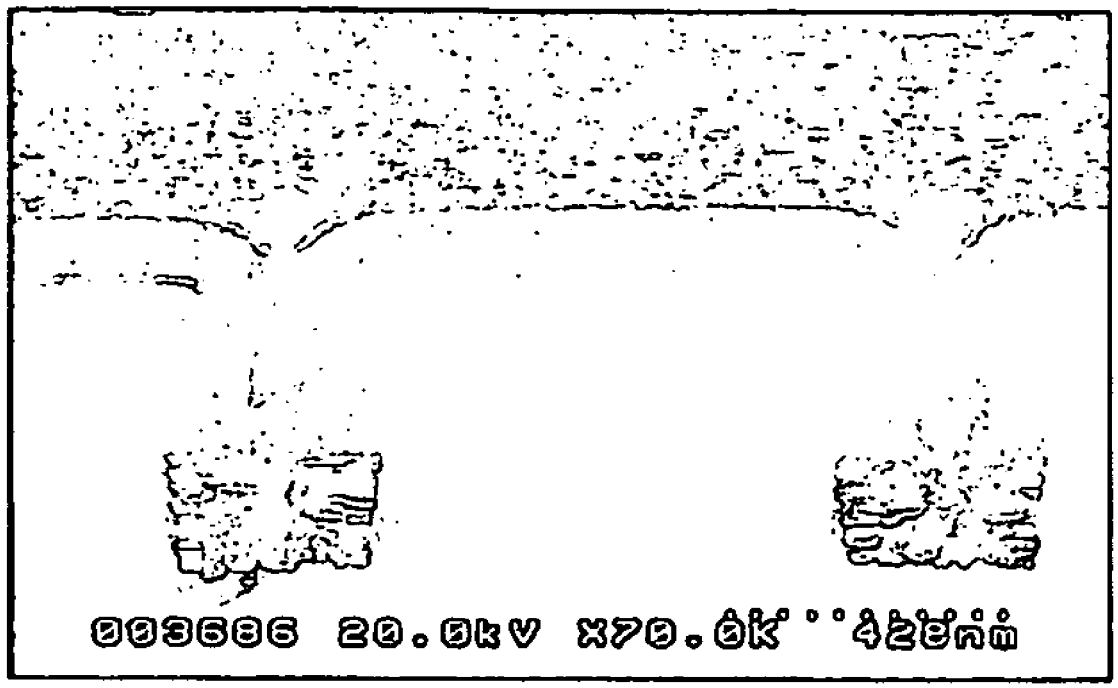
FIG. 7 is an SEM photograph of an NiO data storage layer.

FIG. 7 is an SEM photograph of a NiO data storage layer having a three-dimensional structure.

According to embodiments of the present invention, since the data storage layer may be formed using the CVD method, the data storage layer may have a dense and uniform layer quality. Specifically, the data storage layer may be three-dimensional by forming the data storage layer inside the contact hole of the insulating layer. Thus, the size of the data storage layer may be reduced, and the storage characteristic may not be degraded. The three-dimensional data storage layer may increase the integration of the memory device and decrease the reset current ($I_{reset}$), which is required in data write and erase operations.

While embodiments of the present invention have been particularly shown and described with reference to exemplary embodiments thereof, it will be understood by those of ordinary skill in the art that various changes in form and details may be made therein without departing from the spirit and scope of embodiments of the present invention as defined by the following claims.

What is claimed is:

1. A method of fabricating a nonvolatile memory device, comprising:
    forming a lower electrode connected to a switching element;
    forming an insulating layer on the lower electrode to a first thickness;
    forming a contact hole through the insulating layer to expose the lower electrode;
    forming a data storage layer completely filling the contact hole, the data storage layer including a transition metal oxide; and
    forming an upper electrode on the insulating layer and the data storage layer; wherein
        a resistance state of the data storage layer is switchable between a high resistance state and a low resistance state in response to voltages in different voltage ranges, the voltages and the different voltage ranges having the same polarity, and
        a height of the data storage layer is larger than a width of the data storage layer.

2. The method of claim 1, wherein the transition metal oxide is selected from the group consisting of Ni oxide, V oxide, Zn oxide, Nb oxide, Ti oxide, W oxide, and Co oxide.

3. The method of claim 1, wherein the data storage layer is formed using a chemical vapor deposition method.

4. A method of fabricating a nonvolatile memory device, comprising:
    forming a lower electrode connected to a switching element;
    forming an insulating layer on the lower electrode to a first thickness;
    forming a contact hole through the insulating layer to expose the lower electrode;
    forming a data storage layer including a transition metal oxide in the contact hole; and
    forming an upper electrode on the insulating layer and the data storage layer; wherein
        the data storage layer is formed using a chemical vapor deposition method, and oxygen content of the transition metal oxide is controlled by alternately injecting at least one of $H_2O$, $O_2$, and $O_2$-activated plasma gas as oxygen sources during the chemical vapor deposition method.

5. The method of claim 1, wherein the insulating layer comprises $SiO_2$.

6. The method of claim 1, wherein the switching element is a transistor or a switching diode.

7. The method of claim 1, wherein the data storage layer is formed to have a three-dimensional structure.

8. The method of claim 1, wherein the insulating layer is formed as a planar layer in contact with the lower electrode, and the upper electrode is formed as a planar layer in contact with upper surfaces of the insulating layer and the data storage layer, and wherein the insulating layer surrounds the data storage layer and has a width approximately the same as the width of the lower electrode.

9. The method of claim 8, wherein the switching element is a transistor with a source, a drain, a channel, and a gate electrode, and wherein the lower electrode of the data storage part contacts an upper surface of the drain.

10. The method of claim 1, wherein the lower electrode is formed to contact a lower surface of the data storage layer, and the upper electrode is formed to contact an upper surface of the data storage layer, and wherein an upper surface of the lower electrode and a lower surface of the upper electrode have approximately the same surface area.

11. The method of claim 1, wherein an oxygen content of the transition metal oxide is controlled by alternately injecting at least one of $H_2O$, $O_2$, and $O_2$-activated plasma gas as oxygen sources during the chemical vapor deposition method.

* * * * *